United States Patent [19]

Trethewey

[11] Patent Number: 4,859,955
[45] Date of Patent: Aug. 22, 1989

[54] APPARATUS FOR SMOOTHING AN ABRUPT CHANGE IN SIGNAL LEVEL

[75] Inventor: Paul M. Trethewey, Penn Valley, Calif.

[73] Assignee: The Grass Valley Group, Inc., Grass Valley, Calif.

[21] Appl. No.: 795,676

[22] Filed: Nov. 6, 1985

[51] Int. Cl.[4] .......................... H03B 1/00; H03K 5/00
[52] U.S. Cl. ..................................... 328/169; 328/167; 307/263; 330/279
[58] Field of Search ............... 307/263, 264, 549, 555, 307/517, 543; 328/114, 116, 142, 169, 181, 185, 162; 330/278, 279, 282, 284, 129, 131

[56] References Cited

U.S. PATENT DOCUMENTS

| | | | |
|---|---|---|---|
| 4,163,948 | 8/1979 | Rieger et al. | 307/549 |
| 4,380,737 | 4/1983 | Sanders | 330/279 |
| 4,430,641 | 2/1984 | Baur et al. | 307/555 |
| 4,563,653 | 1/1986 | Perahia | 330/279 |

OTHER PUBLICATIONS

Malvar, "Electronically Tunable Active Filters With OP-AP" IEEE Trans CAS, vol. CAS-29, No. 5, May 1982, pp. 333-336.

Franco, "Use of Transconductance Amplifiers", Electronic Design 19, 9/13/76, pp. 98-101.

Primary Examiner—Stanley D. Miller
Assistant Examiner—Timothy P. Callahan
Attorney, Agent, or Firm—Francis I. Gray; John Smith-Hill

[57] ABSTRACT

An apparatus for smoothing an abrupt change in signal level generates a control signal having a curvilinear ramp shape. An amplifier has a step input signal applied to a non-inverting input, a delayed slope control signal applied to a bias terminal, and the output of the amplifier fed back to an inverting input. An RC series circuit is connected between the output of the amplifier and a reference potential, with the control signal taken from the node between the resistor and capacitor. The amplifier is saturated by the step input signal, and is subsequently turned on by the delayed slope control signal so that the amplifier acts initially as a current source for the RC circuit until the slope control signal reaches its full value. Then the RC circuit charges linearly until the intercept voltage of the step input is approached, at which point the amplifier comes out of saturation and acts as a voltage source to exponentially charge the capacitor to the intercept voltage.

4 Claims, 2 Drawing Sheets

APPARATUS FOR SMOOTHING AN ABRUPT CHANGE IN SIGNAL LEVEL

This invention relates to apparatus for smoothing an abrupt change in signal level.

BACKGROUND OF THE INVENTION

A production switcher is used in a television studio to switch selectively between different television signal sources in the production of a final program video signal. Generally, the audio portion of the television signal is separated from the video portion upstream of the production switcher and is recombined with the video portion downstream of the production switcher. The audio portions of the various television signals are combined or selected using a separate audio mixer, because it is not desirable that the audio signal be produced in the same fashion as the video signal. For example, it is quite acceptable to have a rapid switch between two video signals, in an interval on the order of tens of nanoseconds, but if the source of an output audio signal is changed in such a short time, switching transients in the output audio signal will manifest themselves as audible clicks when the audio signal is used to drive a loudspeaker. It is therefore desirable that the switch between a first audio input signal and a second audio input signal should take place over a longer time, for example on the order of a few milliseconds.

In an audio mixer, it is conventional for the audio input signals to be applied to respective voltage controlled amplifiers and for the output terminals of the VCAs to be connected to the output terminal of the mixer. The gain of each VCA is controlled by applying a control signal to its control input terminal. In order to switch between a first audio input signal and a second audio input signal, the control voltage applied to the VCA in the first signal channel is decreased while the control voltage applied to the VCA in the second signal channel is increased. However, if a linear ramp is used as the control voltage, the discontinuity at the start and end of each ramp generates a switching transient on the audio output signal that may be observed as a click. In order to eliminate these clicks, it is necessary to round both ends of the ramp so as to eliminate substantial discontinuities.

It is known to use passive filters constructed of reactive circuit elements to shape the waveforms of control signals that are used in a video production switcher. However, such passive filter devices are not suitable for use in an audio mixer because of the much longer time constants involved.

SUMMARY OF THE INVENTION

In a preferred embodiment of the invention, apparatus for shaping a step-form input signal and providing a limited slew rate output signal in response thereto comprises an amplifier having its non-inverting input terminal connected to receive the input signal and having an output terminal connected through a resistive circuit element to one side of a capacitive circuit element, the other side of which is connected to a reference potential level. The output terminal of the amplifier is also connected to the inverting input terminal of the amplifier. The amplifier has a control terminal at which it receives a control signal that is representative of the desired slew rate of the output signal. The amplifier has the property that it provides at its output terminal a current that varies linearly between a maximum value of one polarity and a maximum value of the opposite polarity when the potential of the non-inverting terminal relative to the inverting terminal varies between a predetermined positive limit value and a predetermined negative limit value. The two extreme values of the current provided at the output terminal of the amplifier are determined by the control signal, which is applied to the control terminal through a low pass filter.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
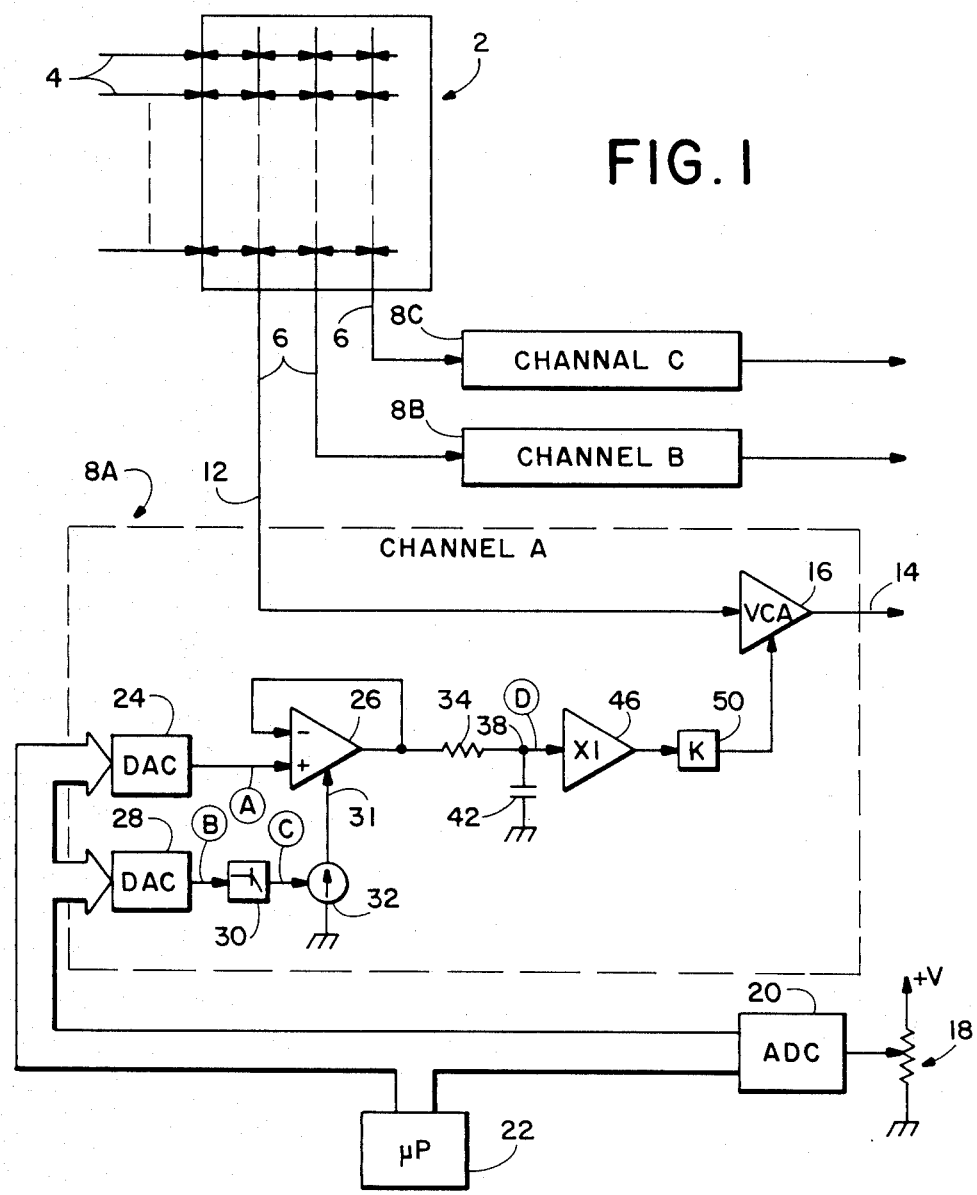
FIG. 1 is a block diagram of an audio mixer.

An audio mixer comprises a crosspoint matrix 2 having nine audio signal input terminals 4 and three audio signal output terminals 6. The audio output terminals are connected to respective output channels 8A, 8B and 8C. In normal use, the channel 8C is referred to as the Over channel, and is used to provide a voice or other audio signal over the audio signal that is associated with the current program video signal. One of the channels 8A and 8B (the Program channel) provides the audio signal associated with the current program video signal, while the third channel (the Preset channel) provides the audio signal associated with the video signal that has been selected to be the next program video signal. At a transition from a program audio signal to the signal that was immediately previously the preset audio signal, so that the Preset channel becomes the Program channel, the channel that was previously the Program channel becomes the Preset channel.

The three channels are essentially identical, and therefore only the channel 8A will be described in detail. The audio signal channel 8A has an input terminal 12 and an output terminal 14, and contains a voltage controlled amplifier (VCA) 16 connected between the input terminal 12 and the output terminal 14. The VCA has a range of possible gain values from 0 to 1, and therefore it acts as a variable attenuator.

On a control panel, a user-activated volume control potentiometer 18 provides at its wiper a voltage signal representative of the amount by which it is desired that a signal passing through the channel should be attenuated. This voltage value is converted to digital form by an analog-to-digital converter (ADC) 20 and is applied to a microprocessor 22. The microprocessor compares the desired value of the attenuation factor, as represented by the digital signal provided by the ADC 20, with the actual value of the attenuation factor, represented by a digital signal applied to a digital-to-analog converter (DAC) 24, and if the desired value is different from the actual value the microprocessor adjusts the input to the DAC 24 accordingly. The output voltage of the DAC 24 is applied to the non-inverting input terminal of an operational transconductance amplifier (OTA) 26, the output voltage of which is used to generate the control voltage for the VCA 16.

The microprocessor also applies a digital signal representative of the change in the desired value of the attenuation factor to an internal look-up table which causes the microprocessor to provide at its output a digital output signal representative of the magnitude of the slew rate with which the change between the actual value of the attenuation factor and the desired new, or intercept, value should take place. This slope signal is converted to analog form by a second DAC 28 and the analog ouput signal of the DAC 28 is applied through a low-pass filter 30 to a voltage-controlled current source 32.

The OTA 26 has a bias current input terminal 31 that is connected to the voltage-controlled current source 32. The OTA 26 mirrors the bias current applied to the terminal 31 into a positive or negative current at its output terminal, depending on the relative polarities of its input terminals. If the non-inverting terminal is more positive than the inverting terminal, current flows out of the amplifier by way of its output terminal, i. e. it acts as a current source. If the relative polarity is reversed, the amplifier acts as a current sink. The OTA has a narrow range of linear operation: if the potential difference between the input terminals exceeds a few millivolts, the amplifier saturates and the current at its output is limited by the value of the bias current. The OTA may be of known form, for example integrated circuit type CA 3080.

The output terminal of the OTA 26 applies negative feedback to the OTA and is connected through a resistor 34 to a node 38. A capacitor 42 is connected between the node 38 and ground, and the node 38 is also connected through a buffer 46 and a scaling network 50 to the control terminal of the VCA 16.

Figure 2:
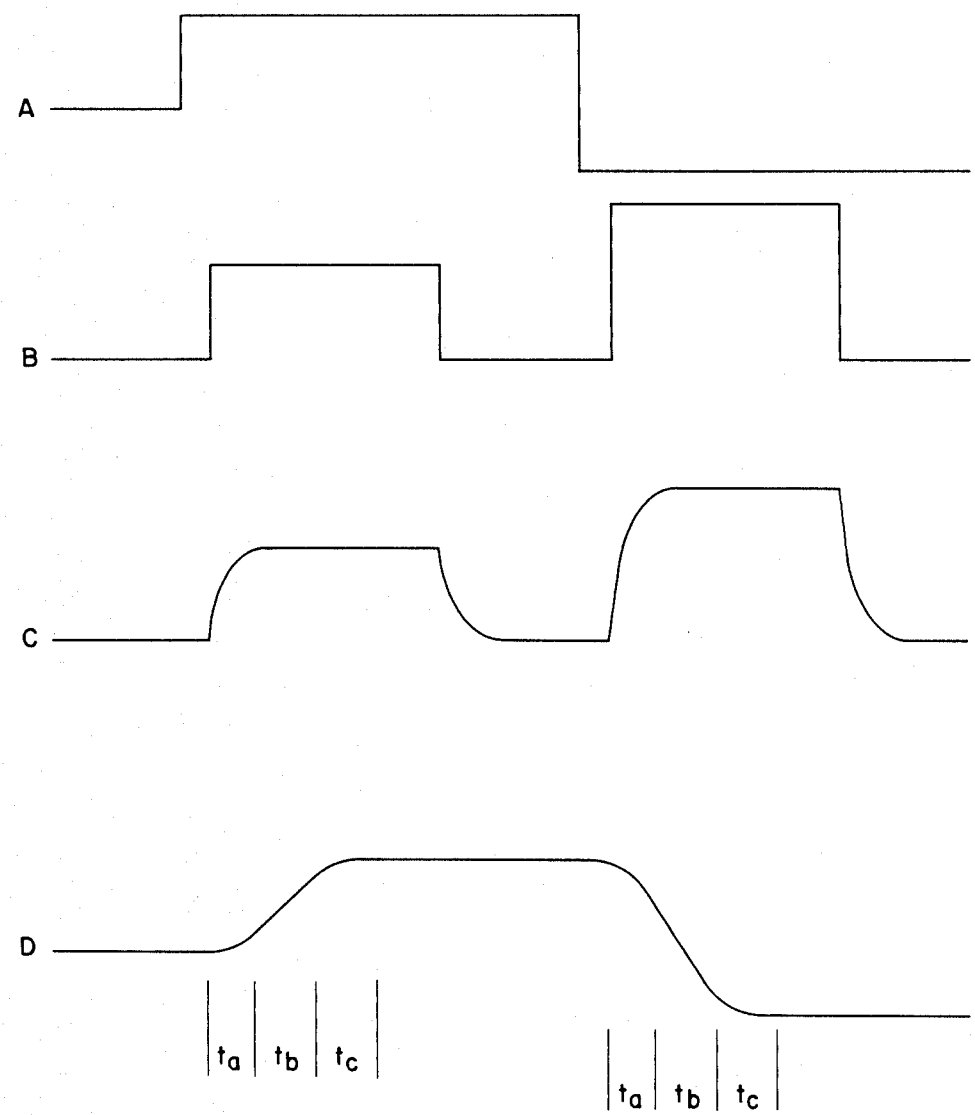
FIG. 2 shows four waveforms to illustrate operation of smoothing apparatus that forms part of the audio mixer.

The function of the OTA 26, the low pass filter 30 and the associated components is to convert a step transistor in the output of the DAC 24 to a curvilinear ramp that attains a desired value within an interval determined by the output voltage of the DAC 28. This is accomplished by controlling the rate at which the capacitor 42 is permittd to charge. In the quiescent state, the charge rate is set to zero: the digital signal applied to the DAC 28 holds the slope voltage at zero until shortly after the change in the intercept voltage applied to the OTA 26 has taken place. Assuming that the setting of the potentiometer 18 is changed, the microprocessor first causes the digital signal applied to the DAC 24 to change. The microprocessor also applies a digital signal representative of the change in the value of the control voltage to be applied to the look-up table. The look-up table enables the microprocessor 22 to generate a second digital signal representative of the desired slope or rate of change of the control voltage. This second digital signal is then applied to the DAC 28, which provides the slope voltage at its output. The slope voltage is applied to the low pass filter 30. The OTA 26 is therefore driven into saturation, but its output current is zero. The microprocessor processor then increases the slope voltage to the desired value, and the action of the low pass filter 30 causes the current source 32 to turn on. The OTA 26 remains saturated, and acts as a current source and charges the capacitor 42 through the resistor 34 with a current that is proportional to the bias current provided by the current source 32. This occurs during the interval $t_a$ shown in FIG. 2. At the end of the interval $t_a$, the transient on the output of the low pass filter 30 decays, and the current provided by the OTA 26 remains constant. Therefore, the voltage at the node 38 increases linearly, as shown during the interval $t_b$. When the output voltage of the OTA 26 approaches its input voltage, i. e. the voltage at the node 38 is within a few millivolts of the intercept voltage minus the potential drop across the resistor 34 (the product of the bias current and the value of the resistor 34), the OTA comes out of saturation and acts as a voltage source, charging the capacitor 42 exponentially through the resistor 34, as shown in the interval $t_c$. It will therefore be seen that the step change in the intercept voltage is converted into a smooth S-curve that approximates the step response of a Gaussian filter. Therefore, the waveform at the node 38 contains a minimum of high-frequency components for a given rise time, and when applied to the control input of the VCA it permits a rapid transition to be made without generating transients that would manifest themselves as audible clicks.

In the preferred form of the audio mixer, the microprocessor 22 polls the output of the ADC 20 once during each field of the corresponding video signal. The values stored in the look-up table are selected to ensure that the node 38 can be brought to the value of the intercept voltage within one field of the video signal.

By use of the illustrated circuit arrangement, it is possible to ensure that the actual value of the control voltages for the VCA will attain the intercept value and will not overshoot or undershoot. The time taken to reach the intercept value is controlled. The slew rate is adjusted during the transition to ensure that a smooth change in control voltage is provided.

It will be appreciated that the invention is not restricted to the particular circuit arrangement that has been described and illustrated, and that variations may be made therein without departing from the scope of the invention as defined in the appended claims, and equivalents thereof. For example, although it is convenient to use the combination of a low pass filtered voltage-controlled current source and an operational transconductance amplifier to provide the desired relationship between the slope voltage and the output current of the OTA, this arrangement of components is not essential since it would be possible to use instead an analog multiplier or voltage-controlled amplifier and a voltage-to-current converter. Also, it is not intended that the invention be limited to audio applications, since the shaping of the waveform at the node 38 may be used in other applications.

I claim:

1. Apparatus for receiving a step-form input signal and providing a limited slew rate output signal in response thereto, comprising:

amplifier means having a signal input terminal for receiving the step-form input signal, an output terminal and a slope-control terminal, the amplifier means being operative to provide at said output terminal a current that is variable linearly between a maximum value of one polarity and a maximum value of the opposite polarity when the potential of the input terminal relative to the output terminal varies within a predetermined range, the magnitudes of said maximum values being dependent on the magnitude of a control signal applied to said slope-control terminal, a resistive circuit element and a capacitive circuit element connected in series between the output terminal and a reference potential level, with the resistive circuit element being connected to the output terminal and the capacitive circuit element being connected to the reference potential level, the limited slew rate output signal being taken from a node between the resistive and capacitive circuit elements, and means for maintaining the current provided by the amplifier means at a minimal value for a predetermined interval following a change in the magnitude of the step-form signal by delaying the control signal for the predetermined interval.

2. Apparatus according to claim 2, wherein the amplifier means comprises:
   an operational transconductance amplifier having a bias terminal,
   a voltage-controlled current source connected to the bias terminal of the amplifier to provide bias current thereto and having a control terminal, and
   a low pass filter connected between said slope-control terminal and the control terminal of the voltage-controlled current source to shape the control signal prior to application to the control terminal.

3. Apparatus according to claim 1, comprising delay means coupled to the slope-control terminal for increasing the current provided by the amplifier means at a reduced rate in response to an increase in the magnitude of the control signal applied to the slope-control terminal.

4. Apparatus according to claim 3, wherein the delay means comprises a low pass filter having the control signal as an input.

* * * * *